United States Patent
Naiss et al.

(10) Patent No.: US 11,070,229 B1
(45) Date of Patent: Jul. 20, 2021

(54) CODEWORD GENERATOR

(71) Applicant: PLIOPS, Ramat Gan (IL)

(72) Inventors: Iddo Naiss, Neve Monoson (IL); Noam Berman, Ramat Gan (IL)

(73) Assignee: PLIOPS, Ramat Gan (IL)

( * ) Notice: Subject to any disclaimer, the term of this patent is extended or adjusted under 35 U.S.C. 154(b) by 0 days.

(21) Appl. No.: 16/877,444

(22) Filed: May 18, 2020

Related U.S. Application Data (60) Provisional application No. 62/849,916, filed on May 19, 2019.

(51) Int. Cl.
H03M 7/40 (2006.01)

(52) U.S. Cl.
CPC .................... H03M 7/40 (2013.01)

(58) Field of Classification Search
CPC ........ H03M 7/40; H03M 7/405; H03M 13/09; H03M 13/13; H04N 19/61; H04N 19/176; H04N 19/625
USPC ......................................... 341/107; 714/796
See application file for complete search history.

(56) References Cited

U.S. PATENT DOCUMENTS

| | | | |
|---|---|---|---|
| 5,559,956 A | 9/1996 | Sukegawa | |
| 5,598,370 A | 1/1997 | Niijima | |
| 6,377,500 B1 | 4/2002 | Fujimoto | |
| 6,684,289 B1 | 1/2004 | Gonzalez | |
| 7,171,513 B2 | 1/2007 | Gonzalez | |
| 9,698,819 B1* | 7/2017 | Baranchik | H03M 7/405 |
| 10,541,711 B1* | 1/2020 | Millar | H04L 27/361 |
| 10,749,554 B1* | 8/2020 | Millar | H04L 1/0058 |
| 2008/0111721 A1* | 5/2008 | Reznik | H04N 19/61 341/67 |
| 2009/0096645 A1* | 4/2009 | Yasuda | H03M 7/4006 341/107 |
| 2009/0174583 A1* | 7/2009 | Diaz-Gutierrez | H03M 7/40 341/65 |
| 2012/0087304 A1* | 4/2012 | Porat | H04B 7/043 370/328 |
| 2013/0300591 A1* | 11/2013 | Marpe | H03M 7/46 341/67 |
| 2015/0016542 A1* | 1/2015 | Rosewarne | H04N 19/44 375/240.25 |
| 2015/0263767 A1* | 9/2015 | Shin | H03M 13/13 714/796 |
| 2015/0334405 A1* | 11/2015 | Rosewarne | H04N 19/593 375/240.02 |
| 2017/0179979 A1* | 6/2017 | Hussain | H03M 13/13 |
| 2020/0204829 A1* | 6/2020 | Stepin | G06T 5/002 |

* cited by examiner

Primary Examiner — Lam T Mai
(74) Attorney, Agent, or Firm — Reches Patent (57) ABSTRACT

A method for generating codewords, the method may include obtaining an input tree, converting the input tree to a modified tree in which each symbol score is a power of two, wherein the conversion is responsive to a relationship between the aggregate count of symbols of the input tree and to a certain power to two that is a smallest power of two that exceeds the aggregate count of symbols; and assigning a codeword to each symbol based at least on the symbol counts associated with the leaves of the modified tree.

22 Claims, 9 Drawing Sheets

PRIOR ART

CODEWORD GENERATOR

CROSS REFERENCE

This application claims priority from U.S. provisional patent Ser. No. 62/849,916 filing date May 19, 2019 which is incorporated herein by reference.

BACKGROUND

Figure 1:
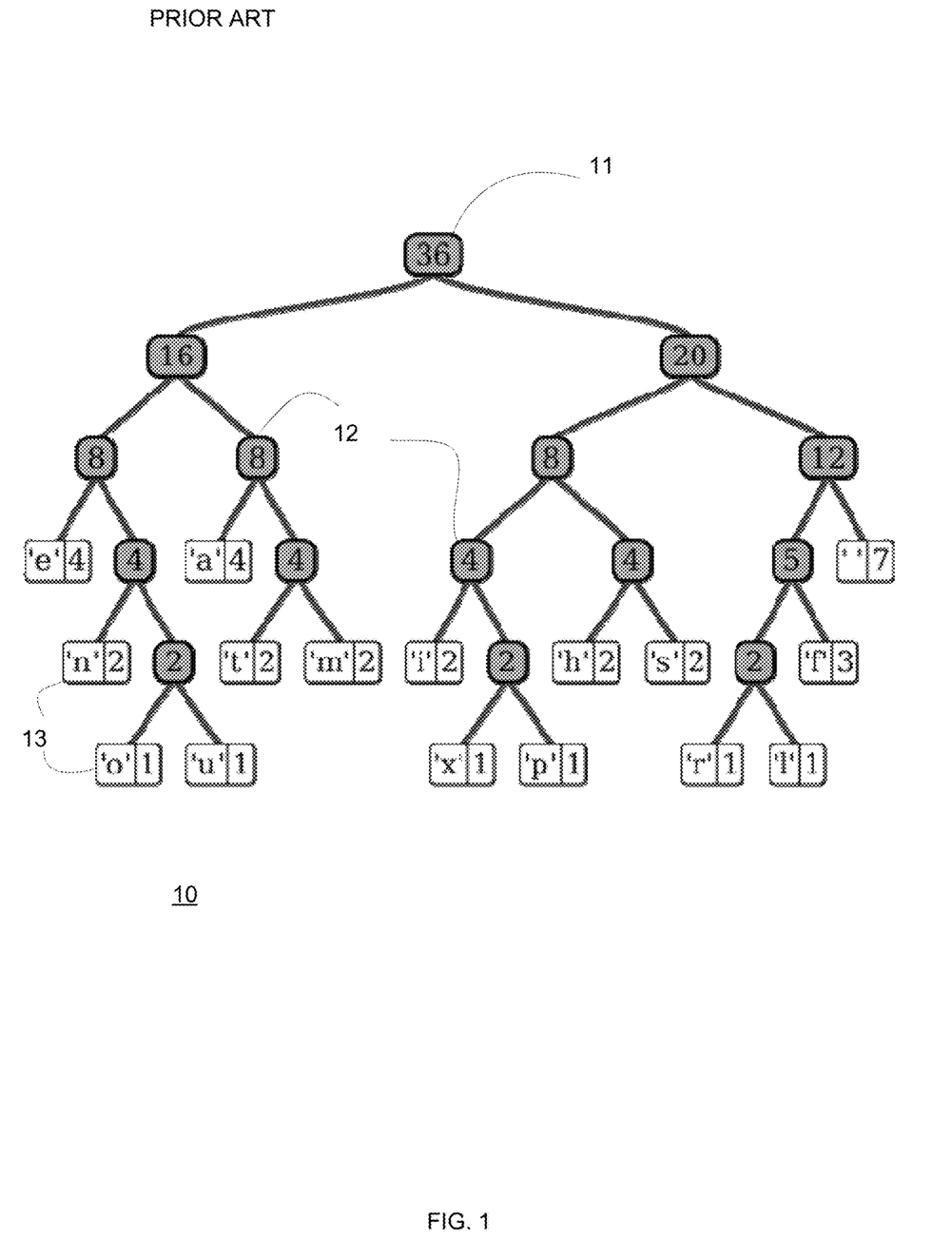
FIG. 1 illustrates an example of a prior art prefix tree.

A Huffman code is variable length coding scheme and is a particular type of optimal prefix code that is commonly used for lossless data compression. The algorithm for creating it is iterative, and the output of it is a prefix tree 10, as seen in FIG. 1. The prefix tree includes root 11, intermediate nodes 12 and leaves 13. Each leaf is associated with a symbol (space (' '), e, a, n, t, m, i, h, s, f, o, u, x, p, r and l) and a symbol count (7, 4, 4, 2, 2, 2, 2, 2, 2, 3, 1, 1, 1 and 1 respectively). In figure the set of letters (symbols), along with their counts (symbol counts), are encoded into a prefix tree. The code is deduced from the tree, as can be seen in table 1:

TABLE 1

| Char | count | Code |
|---|---|---|
| a | 4 | 010 |
| e | 4 | 000 |
| f | 3 | 1101 |
| h | 2 | 1010 |
| i | 2 | 1000 |
| l | 1 | 11001 |
| m | 2 | 0111 |
| n | 2 | 0010 |
| o | 1 | 00110 |
| p | 1 | 10011 |
| r | 1 | 11000 |
| s | 2 | 1011 |
| space | 7 | 111 |
| t | 2 | 0110 |
| u | 1 | 00111 |
| x | 1 | 10010 |

The prefix tree is generated by applying an iterative algorithm that includes sorting the symbol counts, adding the 2 most rare symbol to form a new symbol with cumulative count, and re-sort the new set. The algorithm is concluded when only a single symbol is left.

The consequence of such an algorithm on hardware design is significant. Since the algorithm is iterative, it can't be parallelized. If there is a need to encode symbols, there are required iterations of merge and re-sort, which is of complexity of. In total, forming a Huffman code is of complexity of.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that once executed by a computer result in the execution of the method.

Glossary of the used Terms, Acronyms, Abbreviations a. Symbol—a member of a set which elements form the stream to be compressed
b. Count—the number of times a symbol appeared in the stream
c. Weight—for an element with count, its weight is There may be provided a method that is fast and highly efficient for generating a code which performs almost as good as the Huffman code, with complexity of only. The method is based on the assumption that the number of bits required for a symbol with probability (meaning, it appeared times in a stream of length) is. This means that the prefix tree can be viewed as a mean to skew the probabilities of the symbols to a set of powers of 2, which gives the best averaged length, otherwise known as Entropy. We suggest a different way of skewing the probabilities without sorting and get a close-enough averaged length.

There is provided an example of a method.
The method may include four steps:
A. Normalization of counts (symbol count) to a total sum that is a power of
B. Skewing symbol counts to a power of two.

C. Removing any leftovers from step B.

D. Building a code according to weights (log 2 of new counts).

Steps A and B can be merged.

Step A may be used for bringing the total sum of counts, which is the length of the stream to be compressed, to a power of two. This is done by first finding the required factor (one division—for example in the example of table 1—to 64/36) and then multiply each count by said factor—and round down.

Figure 2:
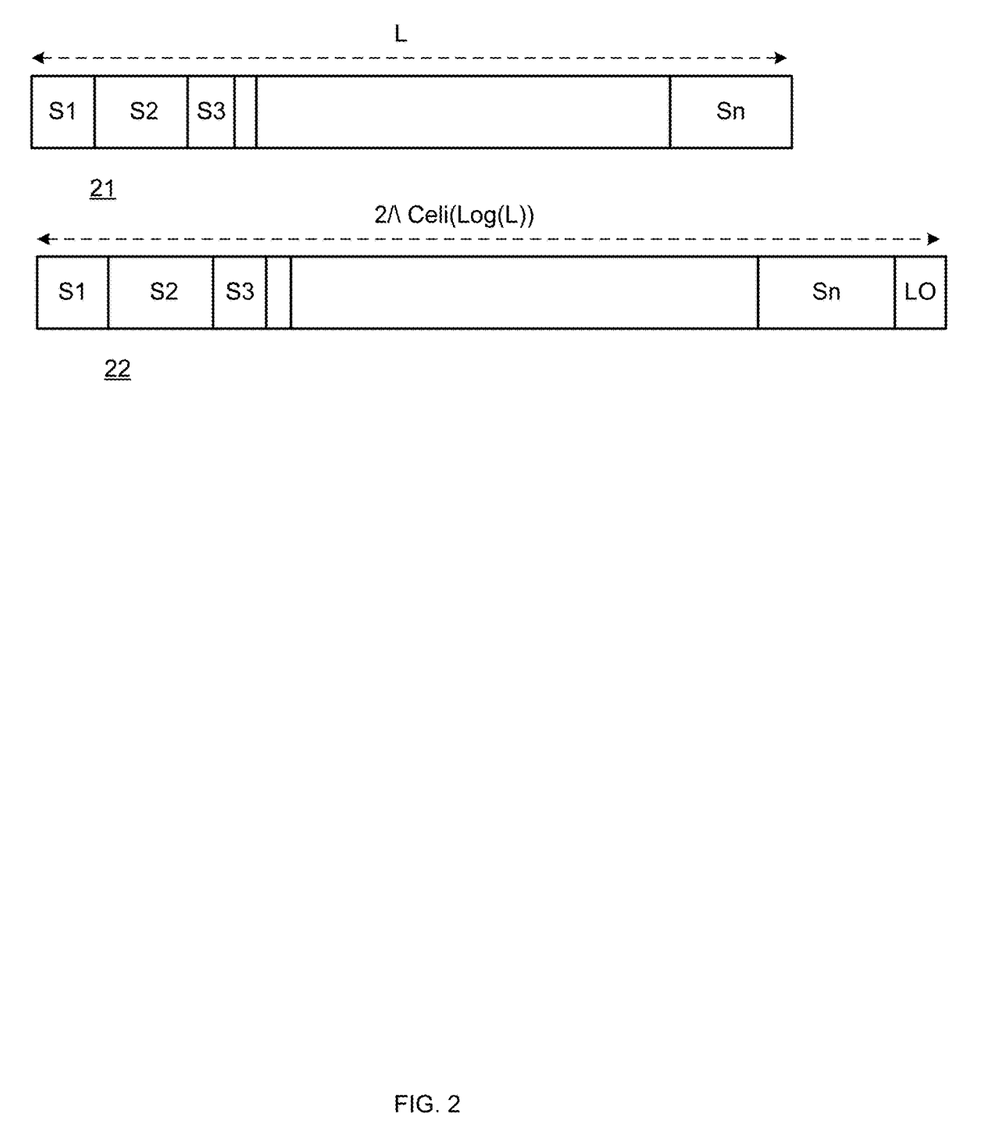
FIG. 2 illustrates an example of data structures.

Since we round down, the new sum is a bit less than a power of two, and we may store the difference in the variable LO (leftover) as can be seen in FIG. 2.

An example to this step is given in Table 2.

TABLE 2

| Char | count | Normalized count |
| --- | --- | --- |
| a | 4 | 7 |
| e | 4 | 7 |
| f | 3 | 5 |
| h | 2 | 3 |
| i | 2 | 3 |
| l | 1 | 1 |
| m | 2 | 3 |
| n | 2 | 3 |
| o | 1 | 1 |
| p | 1 | 1 |
| r | 1 | 1 |
| s | 2 | 3 |
| space | 7 | 12 |
| t | 2 | 3 |
| u | 1 | 1 |
| x | 1 | 1 |

The cumulative sum of the counts in FIG. 1 is 36. The smallest power of two that exceeds thirty six is sixty four. Accordingly—all symbol counts of the input tree (the prefix tree of table 1) are multiplied by, which after rounding down will result with a new set of symbol counts—referred in table 2 as normalized counts.

Following the update of the counts (to provide the normalized count)—the aggregate normalized count is 55—and the LO equals the difference between 64 and 55—which is 9.

Step D may include using the weights for the code construction. This can be done in any known method.

The second and third steps can be implemented in different ways, with implications on performance, complexity and latency.

These different ways may be classified to two classes—considering LO and disregarding LO.

Considering LO

In this case, the method considers the value of LO by keeping it positive. This insures that the result of the skewing part is valid and can be used for generating a code. There may be provided three alternatives here, that provide different tradeoffs between complexity and performance.
  a. Adding LO as a symbol not to be used, causing loss of performance. See the longer codebook 22 obtained when adding LO as a symbol to already existing n symbols S1-Sn. The shorter codebook 21 is obtained when LO is not used as an additional symbol.
  b. Try adjusting upward symbols who was forced down due to small value of LO when handled.
  c. Spreading LO across the symbol set iteratively, using a data structure named.

Various options are illustrated in FIGS. 3-8.

Figure 3:
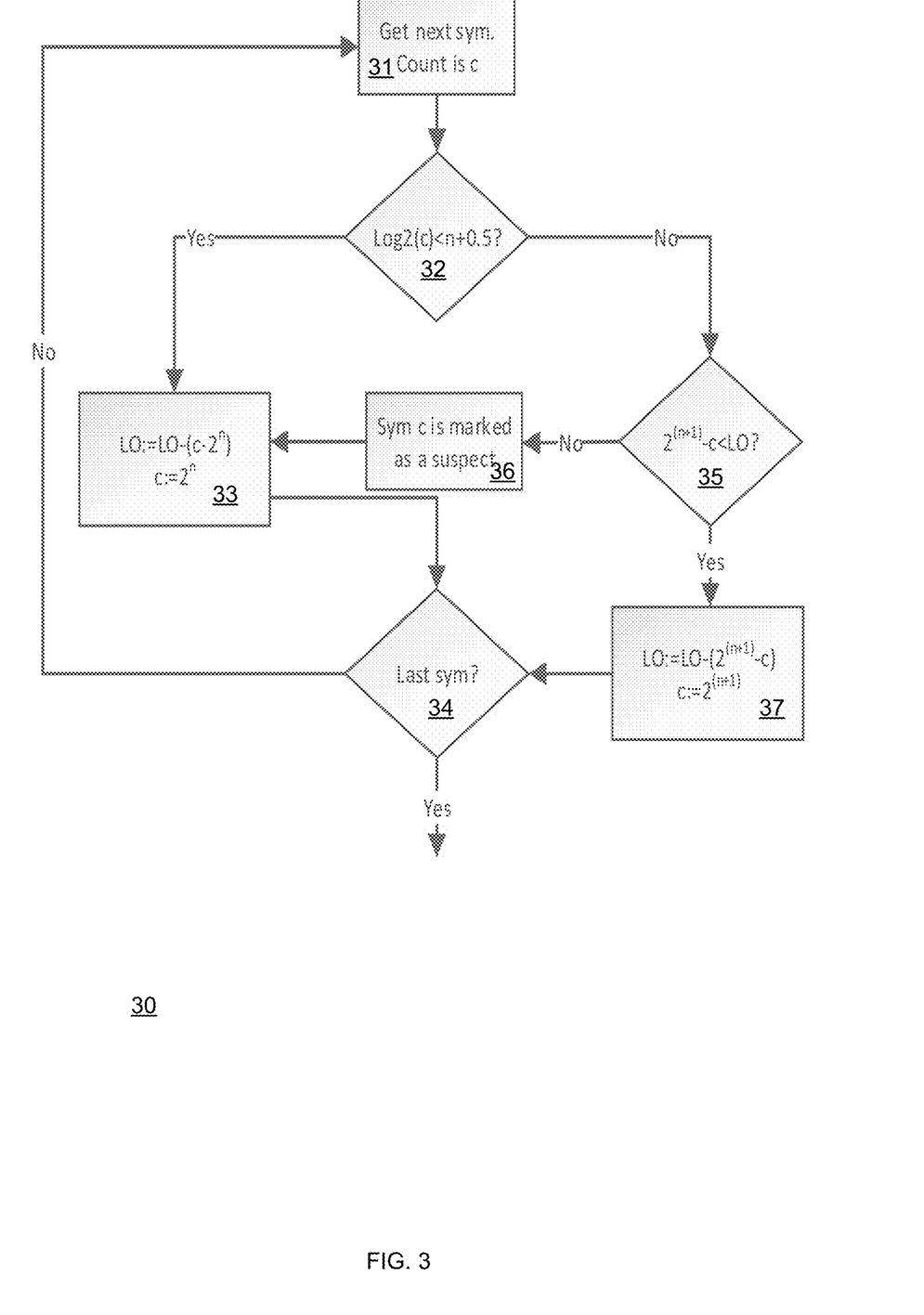
FIG. 3 illustrates an example of a method.

FIG. 3 illustrates method 30 that includes steps 31, 32, 33, 34, 35, 36 and 37.

Figure 4:
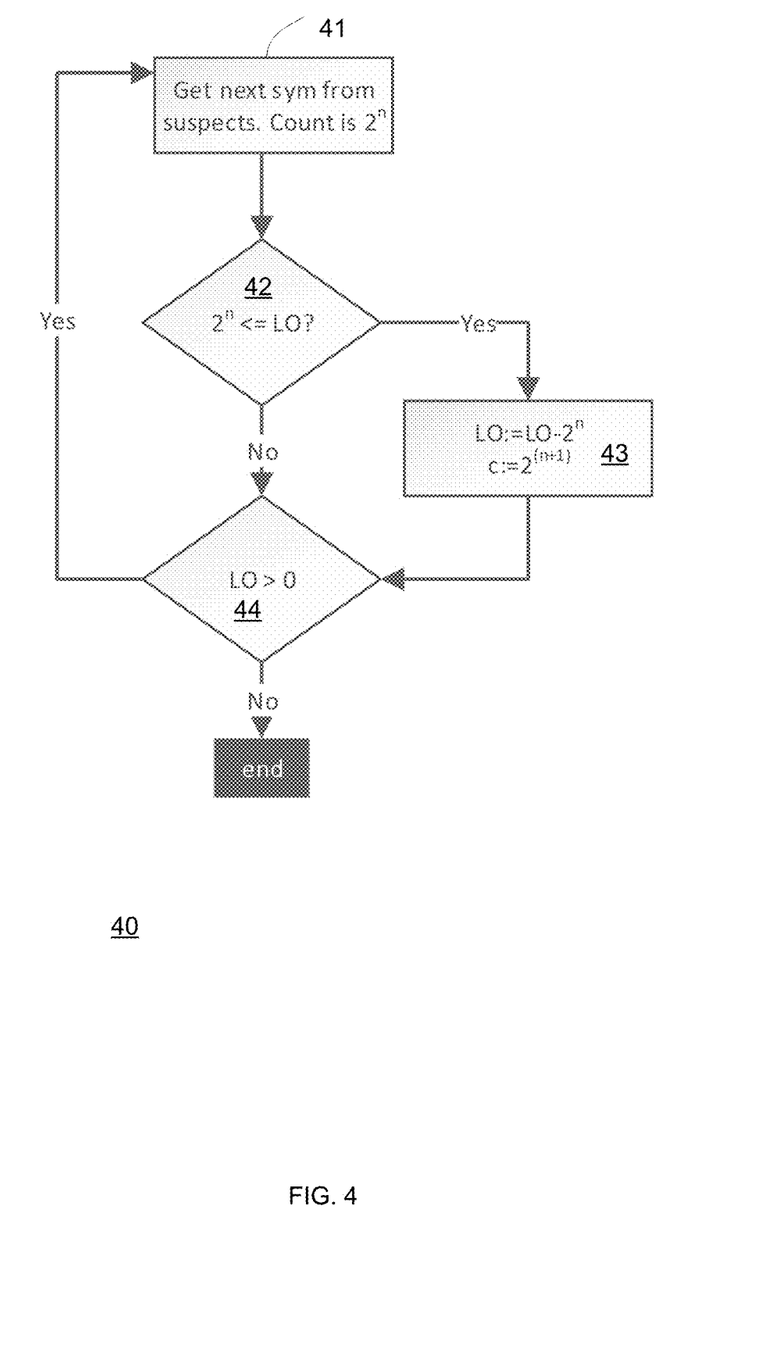
FIG. 4 illustrates an example of a method.

FIG. 4 illustrates method 40 that includes steps 41, 42, 43, 44, 45, 46 and 47.

Methods 30 and 40 are associated with the second option.

Figure 5:
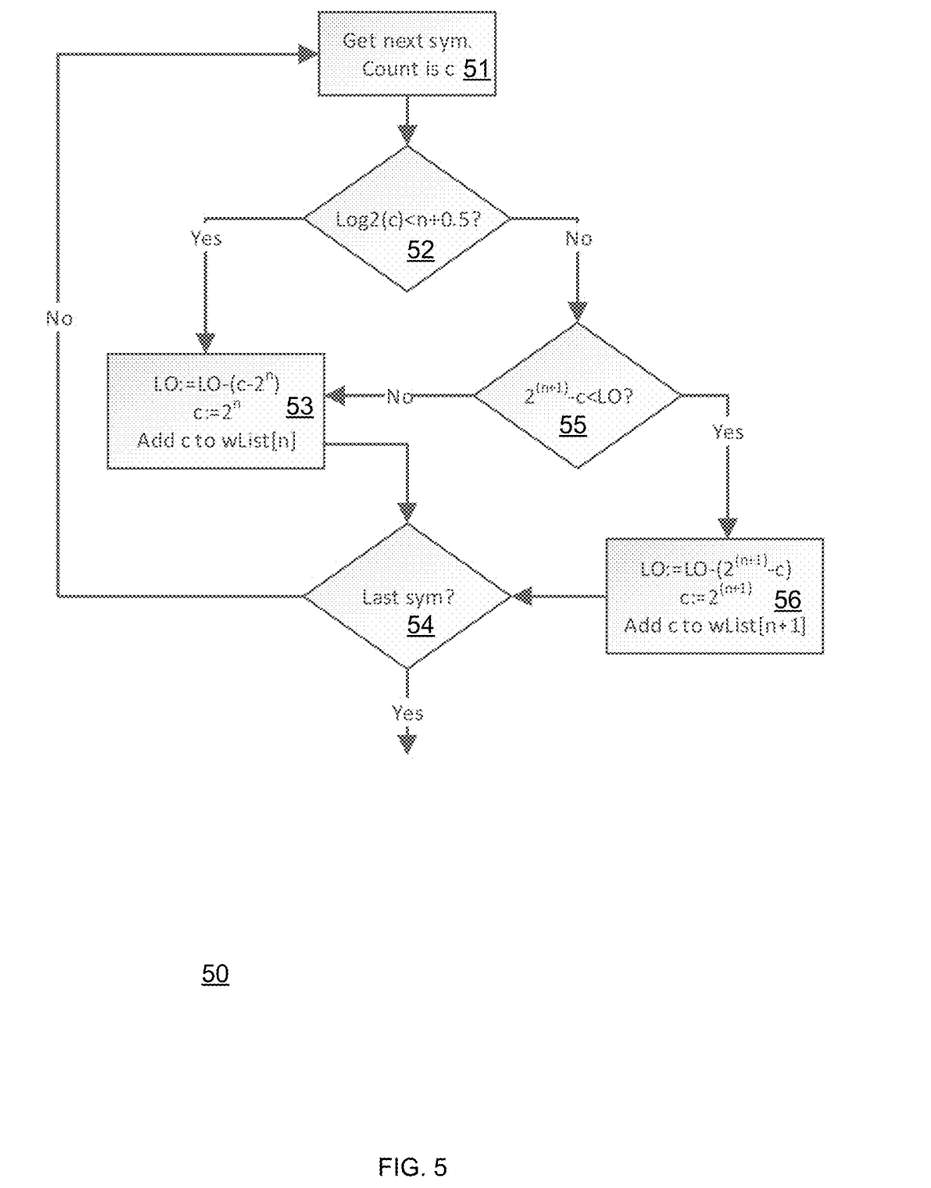
FIG. 5 illustrates an example of a method.

FIG. 5 illustrates method 50 that includes steps 51, 52, 53, 54, 55, 56 and 57.

Figure 6:
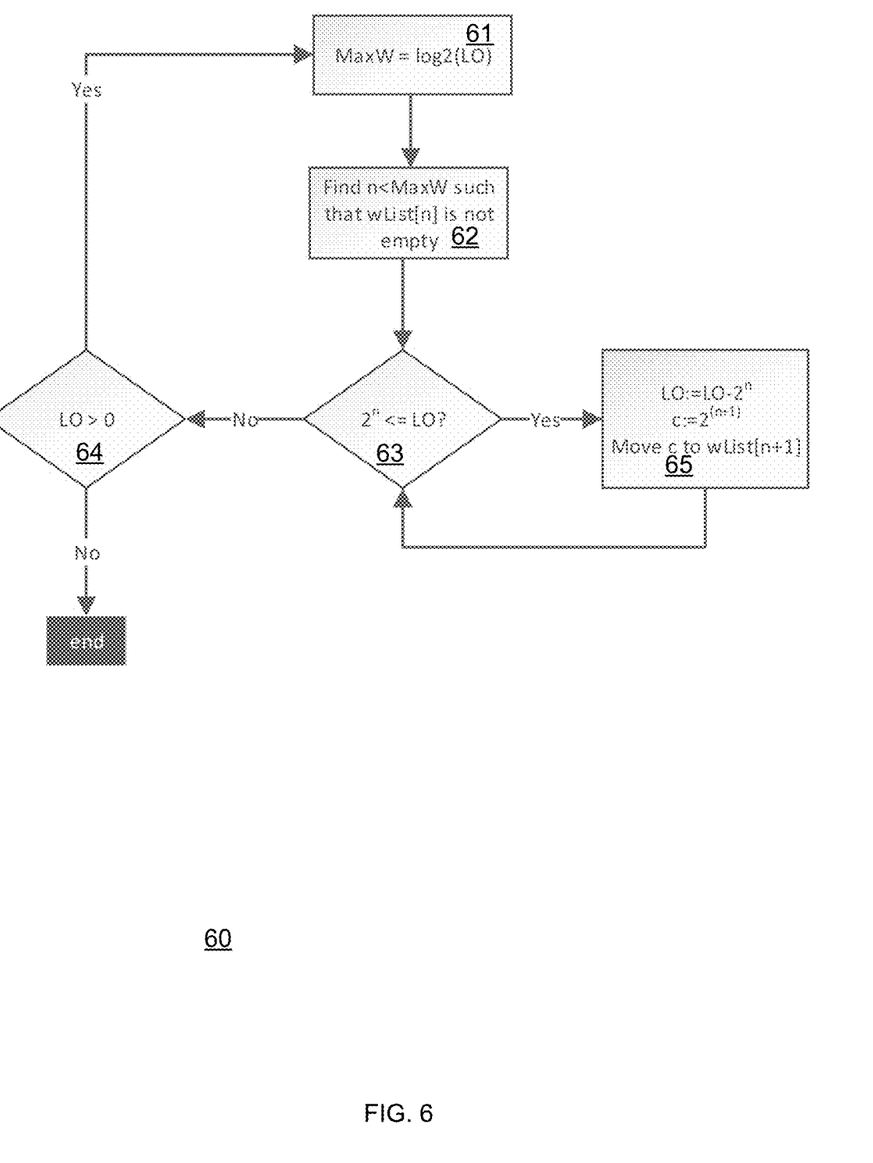
FIG. 6 illustrates an example of a method.

FIG. 6 illustrates method 60 that includes steps 61, 62, 63, 64, 65, 66 and 67.

Figure 7:
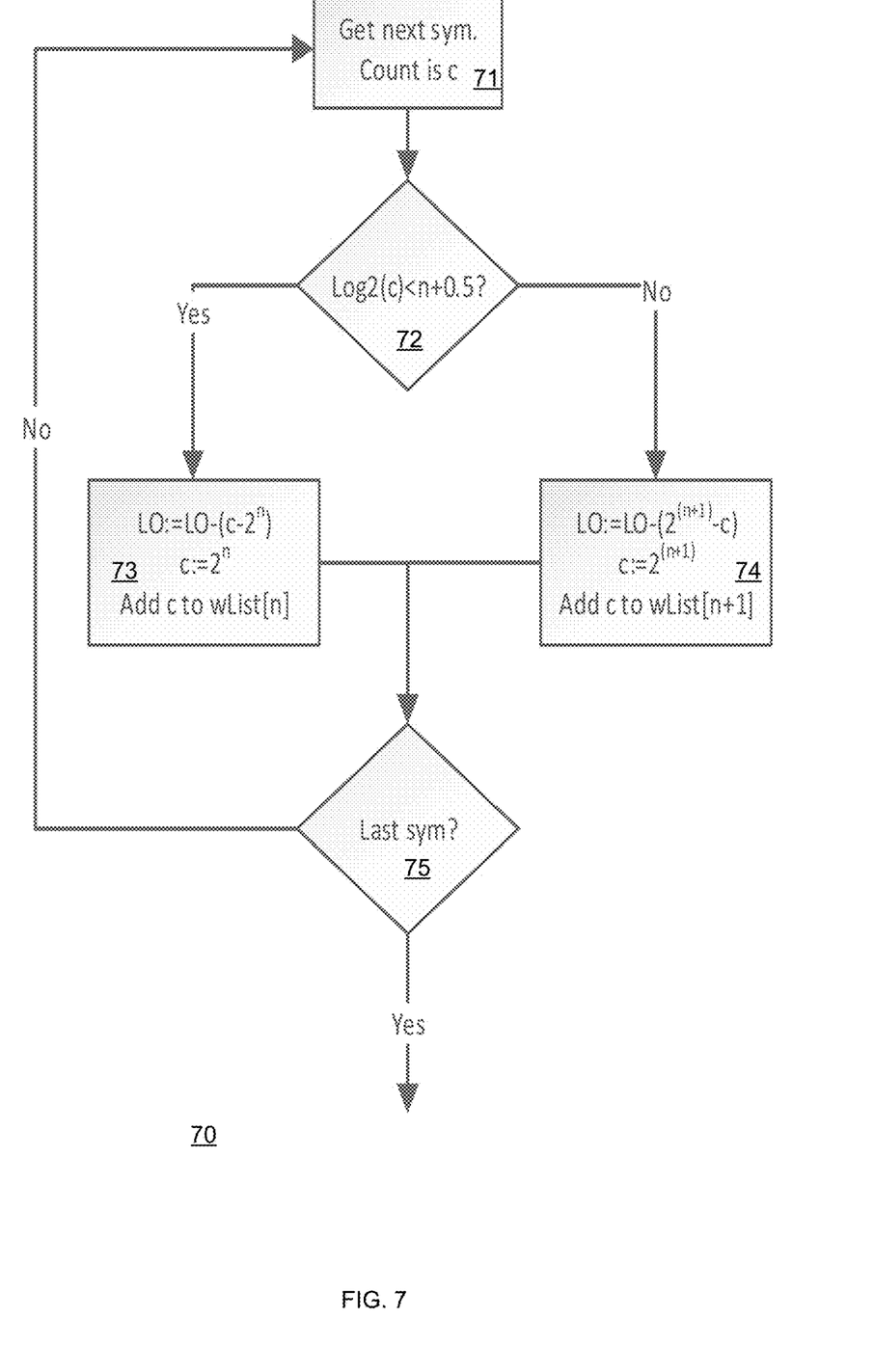
FIG. 7 illustrates an example of a method.

FIG. 7 illustrates method 70 that includes steps 71, 72, 73, 74, 75, 76 and 77.

Figure 8:
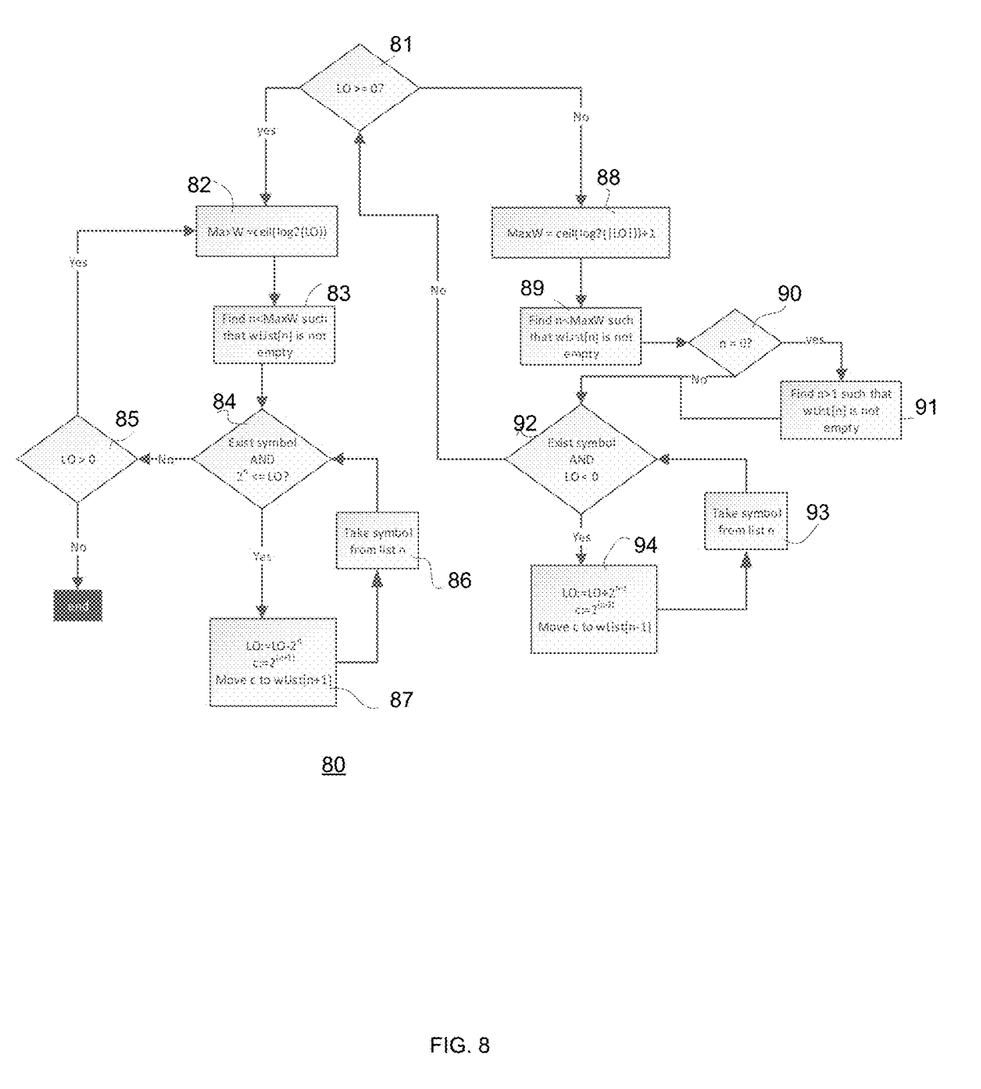
FIG. 8 illustrates an example of a method.

FIG. 8 illustrates method 80 that includes steps 81, 82, 83, 84, 85, 86, 87, 88, 89, 90, 91, 92, 92, 93 and 94.

Methods 50, 60, 70 and 80 belong to the third option. Methods 50 and 60 illustrate first and second parts of a considering LO process. Methods 70 and 80 illustrate first and second parts of a disregarding LO process.

First Option

In step B we increase a symbol count only if it is closer to the higher power of two, and LO allows it.

This can be formed in the following equation

If both conditions exist, we scale the count up. Else, we scale it down. Then, after all symbols have been scaled, we are left with a positive value of. We then refer to LO as a set of symbols of count 1 (weight 0), and hence the performance degrades from To Where r is the ratio. This does not pose a problem for step D (weights to code) if we build the code from high-weight to low-weight symbols.

Second Option.

The second option requires a simple data structure, that stores symbols who were forced down due to low LO value, as described in the first option. When step B is complete, we go over all suspect symbols and try adjusting their count again, in case LO will now allow. This option introduces some complexity, but also improves performance in case some symbols can be adjusted upward. If we are still left with LO>0, we handle it as in first option.

Third Option

The third option requires a sorted data structure. This list stores, for each weight, an ordered set of indices of all symbols sharing it. This list is built during step B and is also used in step C.

The flow for step C is as follows:

While LO>0

A. set

B. find highest weight such that is not empty

C. while AND is not empty
  I. pull out a symbol from list
  II. double symbol count
  III. add symbol to
  IV. decrease by symbol count This procedure guarantees that when it ends—. Hence, we introduce further complexity, with no performance degradation. A flow is described in FIG. 4.

Disregarding LO

Fourth Option

This option may require maintaining a data structure. Here, we do not take into consideration the value of LO when scaling the counts in step B. Each symbol count is shifted toward the closest power of two without constraints. This will cause, after all symbols have been processed, an unknown value of LO, positive or negative.

That is handled in step B: In case is negative, we follow a similar flow to the one in the second option.

While
  A. set
  B. find highest weight such that is not empty
  C. if
    II. find lowest weight such that is not empty
  D. while AND is not empty
    I. pull out a symbol from list
    II. divide symbol count by 2
    III. add symbol to
    IV. increase by symbol count This flow may result with. In that case we follow the flow from second option. The major advantage of this option is that step 2 is no longer sequential, meaning, an operation per symbol is independent. Furthermore, we can combine it with step 1, since we don't have to calculate LO value before starting step 2. This means that we can improve latency by parallelizing symbol scaling. A flow PER SYMBOL is described in FIG. 5. We can scale several symbols in parallel.

We use the setting of FIG. 1, summarized in table 1. The normalization process as described in FIG. 2, produces the counts in Table 2. Now, we perform the algorithm of fourth option. Step B is easy and ends up with scaled counts as in table 3, alongside the code, generated by step D. Step C changes one count, of symbol "f", from count 4 to count 2.

TABLE 3

| Char | count | Normalized count | Scaled counts step B (step C) | Code |
|---|---|---|---|---|
| a | 4 | 7 | 8 | 100 |
| e | 4 | 7 | 8 | 101 |
| f | 3 | 5 | 4 (2) | 00011 |
| h | 2 | 3 | 4 | 0010 |
| i | 2 | 3 | 4 | 0011 |
| l | 1 | 1 | 1 | 000000 |
| m | 2 | 3 | 4 | 0100 |
| n | 2 | 3 | 4 | 0101 |
| o | 1 | 1 | 1 | 000001 |
| p | 1 | 1 | 1 | 000010 |
| r | 1 | 1 | 1 | 000011 |
| s | 2 | 3 | 4 | 0110 |
| space | 7 | 12 | 16 | 11 |
| t | 2 | 3 | 4 | 0111 |
| u | 1 | 1 | 1 | 000100 |
| x | 1 | 1 | 1 | 000101 |
| LO | — | 9 | −2 (0) | |

The example shows that some changes have been caused by the algorithm.
  a. Symbol had probability, which means bits, was shortened from 3 bits to 2
  b. Symbols had probability, which means bits, was extended from 5 bits to 6, and symbol with probability, which means bits, was extended from 4 bits to 5
  c. The loss from that change is easy to calculate:

Another Implementation of the Fourth Option

Actually, if LO<0, increasing it may result with LO>0. If LO>0, decreasing it always results with LO=0.

The following pseudo-code manages both cases—LO positive and LO negative—(where clearly, if we entered with negative LO, we increase it until it is positive, and then decrease it until it is 0. The outcome will not change).
While
  A. set
  B. find highest weight such that is not empty
  C. if
    I.
    II. find lowest weight such that is not empty
  D. set
  E. while AND is not empty
    I. pull out a symbol from list
    II. update
    III. add to
    I. update There may be provided a method for generating a low-complexity prefix code—which can be any of the methods listed above.

The method may include using a single pass on the symbols to create a prefix tree as appose to in Huffman.

The method may include forcing each count to be a power of two if leftover count (LO) allows, and deducing the number of bits it requires by a simple The method may result in ending up with leftover (LO) count that was not assigned to any symbol.

The LO may be used as a symbol not to be used.

The LO may be used to double the count of symbols who were decreased due to small LO when handled.

LO>0 may be spread iteratively across the symbols.

The method may force each count to its closer power of two regardless of LO count, and deduce the number of bits it requires.

The hardware implementation allows parallelization of count scaling, as described in fourth option.

LO<0 may be corrected upward by decreasing symbol counts, leaving positive LO.

Figure 9:
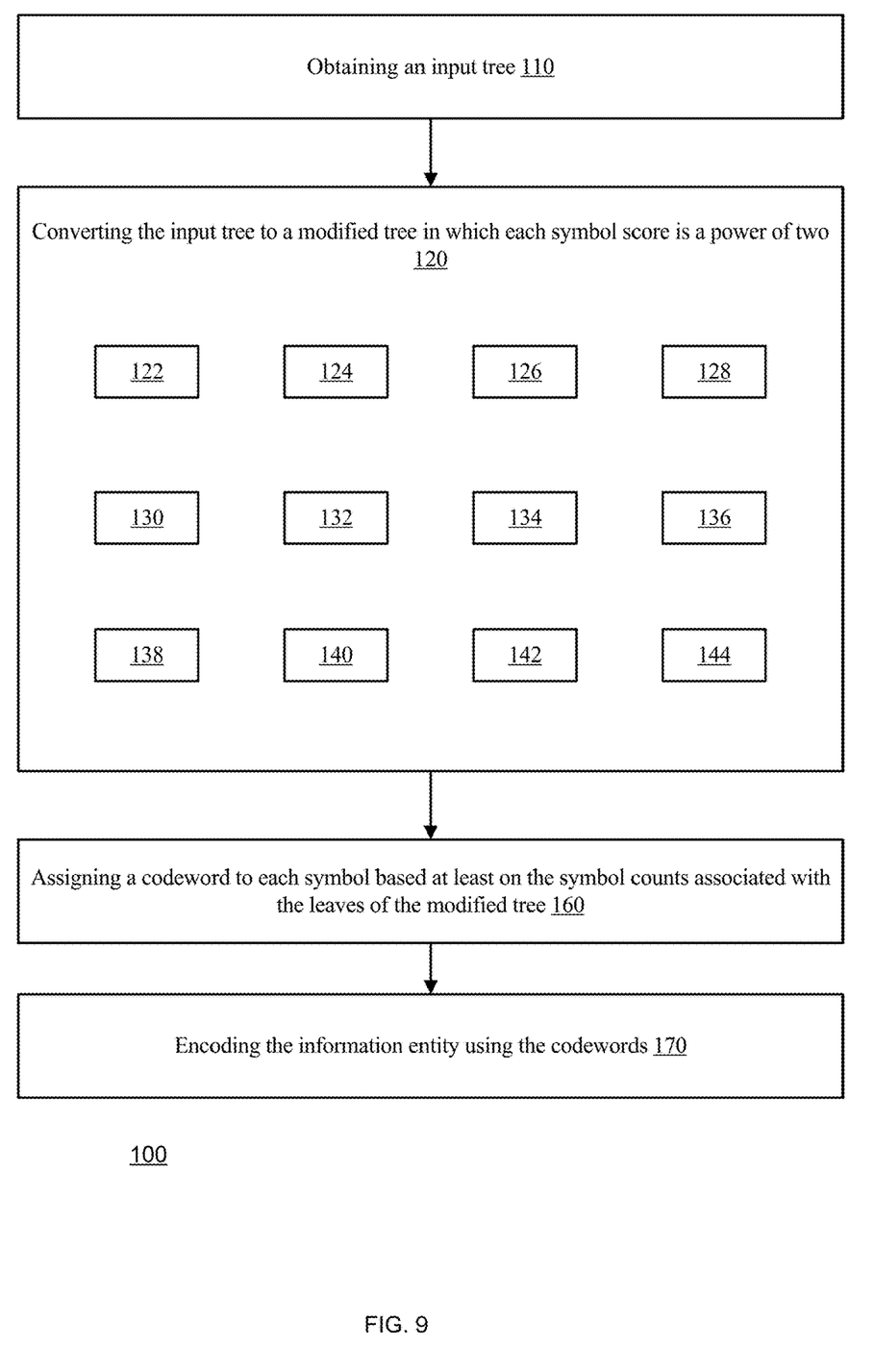
FIG. 9 illustrates an example of a method.

FIG. 9 illustrates an example of method 100. Method 100 may be executed in real time—and may allow to encode vast number of symbols within less than a second—thus reducing any encoding bottleneck that may prevent real time streaming of media. Method 100 may also be executed not in real time.

Method 100 may start by step 110 of obtaining an input tree. This may include receiving or generating information regarding symbols and symbol counts within an information entity.

The input tree may include multiple leaves, a root, and multiple intermediate nodes. Each leaf is associated with a unique symbol (different leaves are associated with different symbols), and a symbol count of the symbol. The symbol count represents a number of appearances of the symbol within an information entity. The information entity may be a file, an information stream or any other aggregation of symbols that should be encoded.

Each intermediate node is associated with a unique combination of at least two symbols and an accumulated count of the members of unique combination. For example—referring to FIG. 1 there are fourteen intermediate nodes, each intermediate node is linked to a unique combinations of symbols. For example—an intermediate node that is associated with an accumulated count 12 is associated with the following combination of symbols—' ', 'f', 'r' and 'l'. The intermediate node that is associated with an accumulated count 5 is associated with the following combination of symbols—'f', 'r' and 'l'.

The root is associated with an aggregate count of symbols associated with any of the leaves. Root 11 of FIG. 1 has an aggregate count of thirty six.

Step 110 is followed by step 120 of converting the input tree to a modified tree in which each symbol score is a power of two.

The conversion is responsive to a relationship between the aggregate count of symbols of the input tree and to a certain power to two that is a smallest power of two that exceeds the aggregate count of symbols. For example—the relationship may be LO.

Step 120 may include any one of the following:
a. Calculating a leftover that represents a difference between (a) the smallest power of two that exceeds the aggregate count of symbols, minus (b) a sum of updated counts generated by the applying of the rounding operation. The rounding may be rounding down. Step 122.
b. Determining whether one or more updated counts may be doubled, and selectively doubling the one or more updated counts based on the determining. The determining may be based on a value of the leftover calculated under an assumption that the one or more updated counts are doubled. This is also referred to as "considering LO". Step 124.
c. Determining by maintaining a non-negative value of the leftover. Step 126.
d. Doubling one or more updated counts regardless of a value of the leftover, and revising at least one updated counts, following the doubling, to comply with a constraint regarding the value of the leftover. This is also referred to as "ignoring LO". Step 128.
e. Selecting updated counts to be doubled by scanning a data structures in which updated counts are grouped by value. An example of such data structure is WeightList [w][ ]. Step 130.
f. Modifying a symbol count of the symbol by multiplying the symbol count by a ratio between the certain power of two and the aggregate count of symbols of the input tree. Step 132
g. Applying a rounding operation on an outcome of multiplying to provide an updated count per each symbol. Step 134.
h. Updating the counts (modified values) while updating the LO accordingly. Step 136.
i. Imposing a constraint on LO and modifying a count unless the value of LO does not permit the modification. For example—see the first option. Step 138.
j. Modifying the counts regardless of the value of LO. This may be followed by updating the counts in view of LO. Step 140.
k. Updating each updated count that is not a power of two to equal a power of two. Step 142.

Step 120 may be followed by step 160 of assigning a codeword to each symbol based at least on the symbol counts associated with the leaves of the modified tree.

Step 160 may be followed by step 170 of encoding the information entity using the codewords.

Method 100 may be executed by a system that comprises a processor. The processor may be a processing circuitry. The processing circuitry may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits. The system may also include memory resources for storing instructions and/or information entity—before and/or after being encoded. The processor may act an encoder and a code generator.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a computer program product such as non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CDROM, CDR, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for generating codewords, the method comprises:
    obtaining an input tree, wherein the input tree comprises leaves, a root, and multiple intermediate nodes; wherein each leaf is associated with a unique symbol and a symbols count of the symbol within an information entity; wherein each intermediate node is associated with a unique combination of at least two symbols and an accumulated count of the members of unique combination; wherein the root is associated with an aggregate count of symbols associated with any of the leaves;
    converting the input tree to a modified tree in which each symbol score is a power of two, wherein the conversion is responsive to a relationship between the aggregate count of symbols of the input tree and to a certain power to two that is a smallest power of two that exceeds the aggregate count of symbols; and
    assigning a codeword to each symbol based at least on the symbol counts associated with the leaves of the modified tree.

2. The method according to claim 1 wherein the converting comprises:
    for each symbol, modifying a symbol count of the symbol by multiplying the symbol count by a ratio between the certain power of two and the aggregate count of symbols of the input tree, and applying a rounding operation on an outcome of multiplying to provide an updated count.

3. The method according to claim 2 comprising updating each updated count that is not a power of two to equal a power of two.

4. The method according to claim 2 comprising calculating a leftover that represents a difference between (a) the smallest power of two that exceeds the aggregate count of symbols, minus (b) a sum of updated counts generated by the applying of the rounding operation.

5. The method according to claim 4 wherein the rounding is rounding down.

6. The method according to claim 4 comprising determining whether one or more updated counts may be doubled, and selectively doubling the one or more updated counts based on the determining.

7. The method according to claim 6 wherein the determining is based on a value of the leftover calculated under an assumption that the one or more updated counts are doubled.

8. The method according to claim 6 wherein the determining comprises maintaining a non-negative value of the leftover.

9. The method according to claim 4 comprising doubling one or more updated counts regardless of a value of the leftover, and revising at least one updated counts, following the doubling, to comply with a constraint regarding the value of the leftover.

10. The method according to claim 4 comprising selecting updated counts to be doubled by scanning a data structures in which updated counts are grouped by value.

11. The method according to claim 1 comprising encoding the information entity using the codewords.

12. A non-transitory computer readable medium that stores instructions that once executed by a computer result in:
    obtaining an input tree, wherein the input tree comprises leaves, a root, and multiple intermediate nodes; wherein each leaf is associated with a unique symbol and a symbols count of the symbol within an information entity; herein each intermediate node is associated with a unique combination of at least two symbols and an accumulated count of the members of unique combination; wherein the root is associated with an aggregate count of symbols associated with any of the leaves;
    converting the input tree to a modified tree in which each symbol score is a power of two, wherein the conversion is responsive to a relationship between the aggregate count of symbols of the input tree and to a certain power to two that is a smallest power of two that exceeds the aggregate count of symbols; and
    assigning a codeword to each symbol based at least on the symbol counts associated with the leaves of the modified tree.

13. The non-transitory computer readable medium according to claim 12 wherein the converting comprises: for each symbol, modifying a symbol count of the symbol by multiplying the symbol count by a ratio between the certain power of two and the aggregate count of symbols of the input tree, and applying a rounding operation on an outcome of multiplying to provide an updated count.

14. The non-transitory computer readable medium according to claim 13 that stores instructions that once executed by a computer result in updating each updated count that is not a power of two to equal a power of two.

15. The non-transitory computer readable medium according to claim 13 that stores instructions that once executed by a computer result in calculating a leftover that represents a difference between (a) the smallest power of two that exceeds the aggregate count of symbols, minus (b) a sum of updated counts generated by the applying of the rounding operation.

16. The non-transitory computer readable medium according to claim 15 wherein the rounding is rounding down.

17. The non-transitory computer readable medium according to claim 16 that stores instructions that once executed by a computer result in determining whether one or more updated counts may be doubled, and selectively doubling the one or more updated counts based on the determining.

18. The non-transitory computer readable medium according to claim 17 wherein the determining is based on a value of the leftover calculated under an assumption that the one or more updated counts are doubled.

19. The non-transitory computer readable medium according to claim 17 wherein the determining comprises maintaining a non-negative value of the leftover.

20. The non-transitory computer readable medium according to claim 19 that stores instructions that once executed by a computer result in doubling one or more updated counts regardless of a value of the leftover, and revising at least one updated counts, following the doubling, to comply with a constraint regarding the value of the leftover.

21. The non-transitory computer readable medium according to claim 19 that stores instructions that once executed by a computer result in selecting updated counts to be doubled by scanning a data structures in which updated counts are grouped by value.

22. The non-transitory computer readable medium according to claim 12 that stores instructions that once executed by a computer result in encoding the information entity using the codewords.

* * * * *